United States Patent
Kameyama (10) Patent No.: US 7,772,043 B2
(45) Date of Patent: Aug. 10, 2010

(54) PLATING APPARATUS, PLATING METHOD AND MANUFACTURING METHOD FOR SEMICONDUCTOR DEVICE

(75) Inventor: Koujiro Kameyama, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 638 days.

(21) Appl. No.: 11/692,695

(22) Filed: Mar. 28, 2007

(65) Prior Publication Data

US 2007/0218590 A1    Sep. 20, 2007

Related U.S. Application Data

(62) Division of application No. 10/487,158, filed on Feb. 18, 2004, now abandoned.

(51) Int. Cl.
H01L 21/44 (2006.01)
H01L 21/48 (2006.01)
H01L 21/50 (2006.01)

(52) U.S. Cl. ...................... 438/123; 438/124
(58) Field of Classification Search ................ 438/123, 438/124
See application file for complete search history.

(56) References Cited

U.S. PATENT DOCUMENTS 6,392,293 B2    5/2002    Sugihara et al.

FOREIGN PATENT DOCUMENTS

| JP | 11-330340 | 11/1999 |
|---|---|---|
| JP | 2001-234389 | 8/2001 |
| JP | 2001-234390 | 8/2001 |
| JP | 2001-254199 | 9/2001 |
| JP | 2001-271200 | 10/2001 |
| KR | 2001-0085638 | 7/2001 |

Primary Examiner—Thien F Tran
(74) Attorney, Agent, or Firm—Fish & Richardson P.C.

(57) ABSTRACT

A semiconductor device with plating film layers for semiconductor device leads is described. A first plating film layer that includes Sn as a main material is formed on a semiconductor device lead in which Cu or Fe—Ni is a main material. The outermost surface of the lead includes a plating film layer in which Sn—Bi is the main material. The plating film layer is formed from a plating liquid in which Bi is introduced from a lead hold means. The Bi content relative to Sn in the first plating film layer is approximately 0 wt. % to 1 wt. %.

14 Claims, 8 Drawing Sheets

FIG.9

PLATING APPARATUS, PLATING METHOD AND MANUFACTURING METHOD FOR SEMICONDUCTOR DEVICE

This application is a divisional and claims the benefit of priority of U.S. Ser. No. 10/487,158, filed on Feb. 18, 2004 now abandoned, which claims the benefit of priority of PCT Application No. JP01/10873, filed on Dec. 12, 2001. The disclosure of those applications are incorporated herein by reference in its entirety.

TECHNICAL FIELD OF THE INVENTION

The present invention relates to a plating apparatus, a plating method and a manufacturing method for a semiconductor device wherein plating film layers are formed on leads and a lead frame having a main material of Cu or an Fe—Ni alloy.

RELATED ART

When a plating material layer of a simple Sn or an Sn alloy is covered on a surface of a conductive member, the conductive member has excellent conductance and mechanical strength. In addition, the conductive member is a high performance conductor that has both resistance to corrosion as well as excellent solderability provided by simple Sn or an Sn alloy. Therefore, the conductive member is widely used in the field of electrical and electronic apparatuses, such as in a variety of terminals, connectors and leads as well as in the field of power cables.

In addition, in the case that a semiconductor chip is mounted on a circuit substrate, a plating is formed on outer lead parts of the semiconductor chip and, thereby, solderability of the outer lead parts is increased. A representative example of such a plating film is solder (Sn—Pb alloy), which has excellent solderability and resistance to corrosion and, therefore, is widely utilized.

Figure 6:
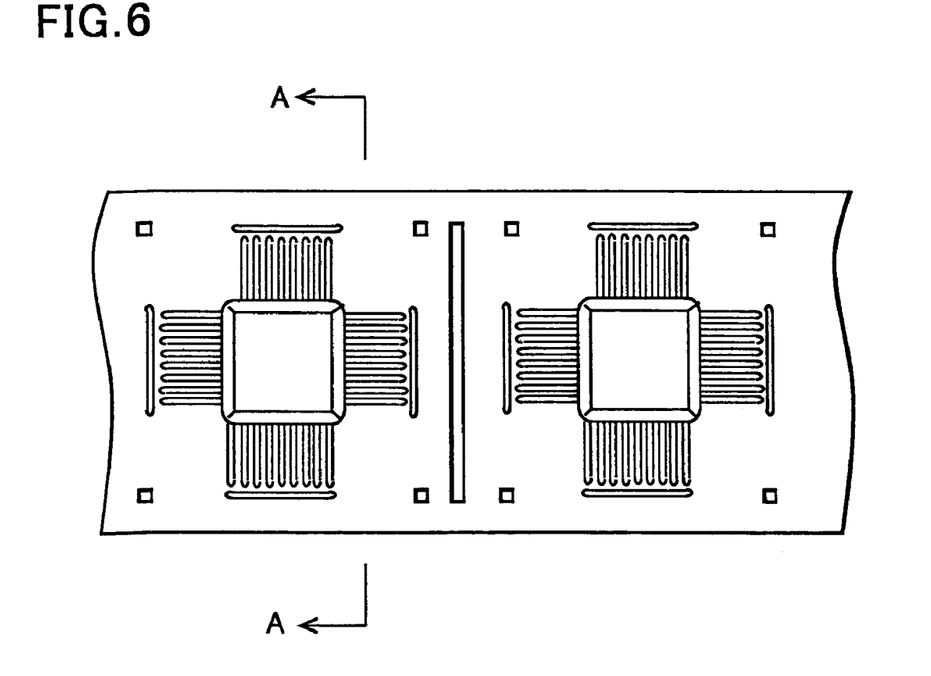
FIG. 6 is a diagram for describing lead frames to which semiconductor chips, which have been plated according to a preferred embodiment or according to related art, are secure.
Figure 7:
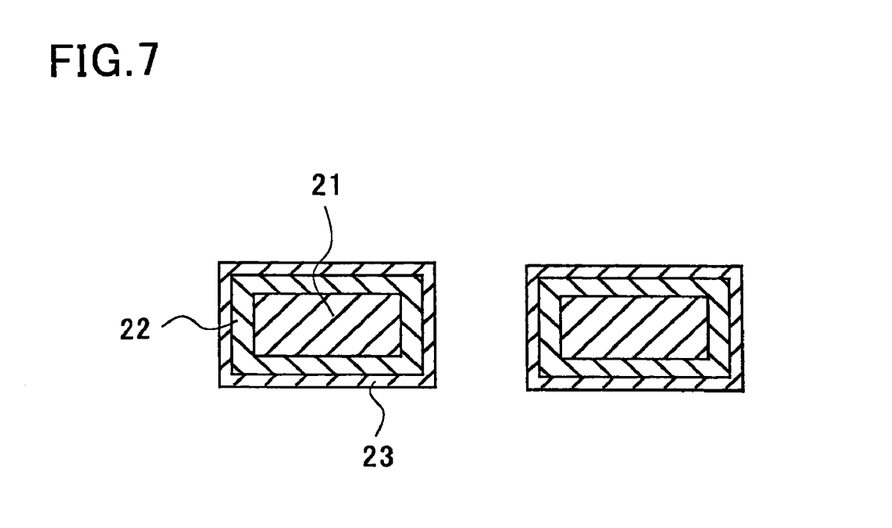
FIG. 7 is a diagram for describing a cross-section, as viewed in the A-A direction, of a semiconductor lead frame formed of two plating film layers shown in FIG. 6 according to a preferred embodiment or according to the related art.

FIG. 7 is a cross sectional view along line A-A of the semiconductor lead frame shown in FIG. 6. A conductive member 21 is formed of, for example, Cu, a Cu-based alloy or an Fe—Ni-based alloy. Then, two plating film layers made of differing materials are placed on the surface of such a conductive member 21. A first plating film 22 made of Sn and a second plating film 23 made of Sn-Bi, for example, are formed, in this order. Here, when the thickness of first plating film. 22 is ti and the thickness of second plating film 3 is t2, it is preferable for ti to be set at approximately 3 pm to 15 pm, for t2 to be set at approximately 1 pm to 5 pm and for t2/t1 to be set at approximately 0.1 to 0.5. In this condition, there are excellent properties from the point of view of cost, solderability, resistance to heat, junction strength with solder and welding strength of the welded portion with an aluminum wire, or the like.

Figure 8:
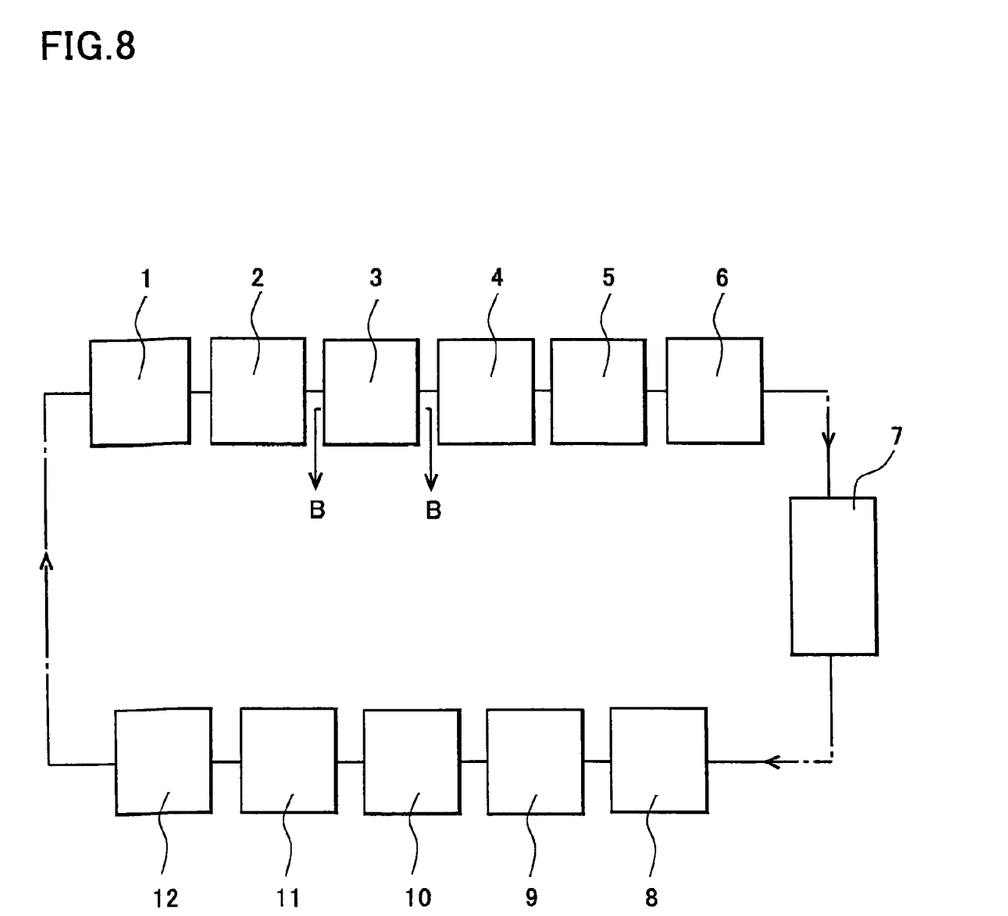
FIG. 8 is a diagram for describing a layout of the entirety of an automatic plating apparatus according to a preferred embodiment or according to the related art.

FIG. 8 is a layout of the entirety of an automatic plating apparatus. First, a pretreatment of the surface of conductive member 21 is carried out in an alkaline electrolytic washing bath 1, and an organic pollutant, that hinders the adhesion and solderability of solder plating film, is removed. Next, the conductive member 21 is washed in a water washing bath 2 and, after that, a chemical etching process (essentially a process utilizing an oxidation-reduction reaction) is carried out.

Figure 9:
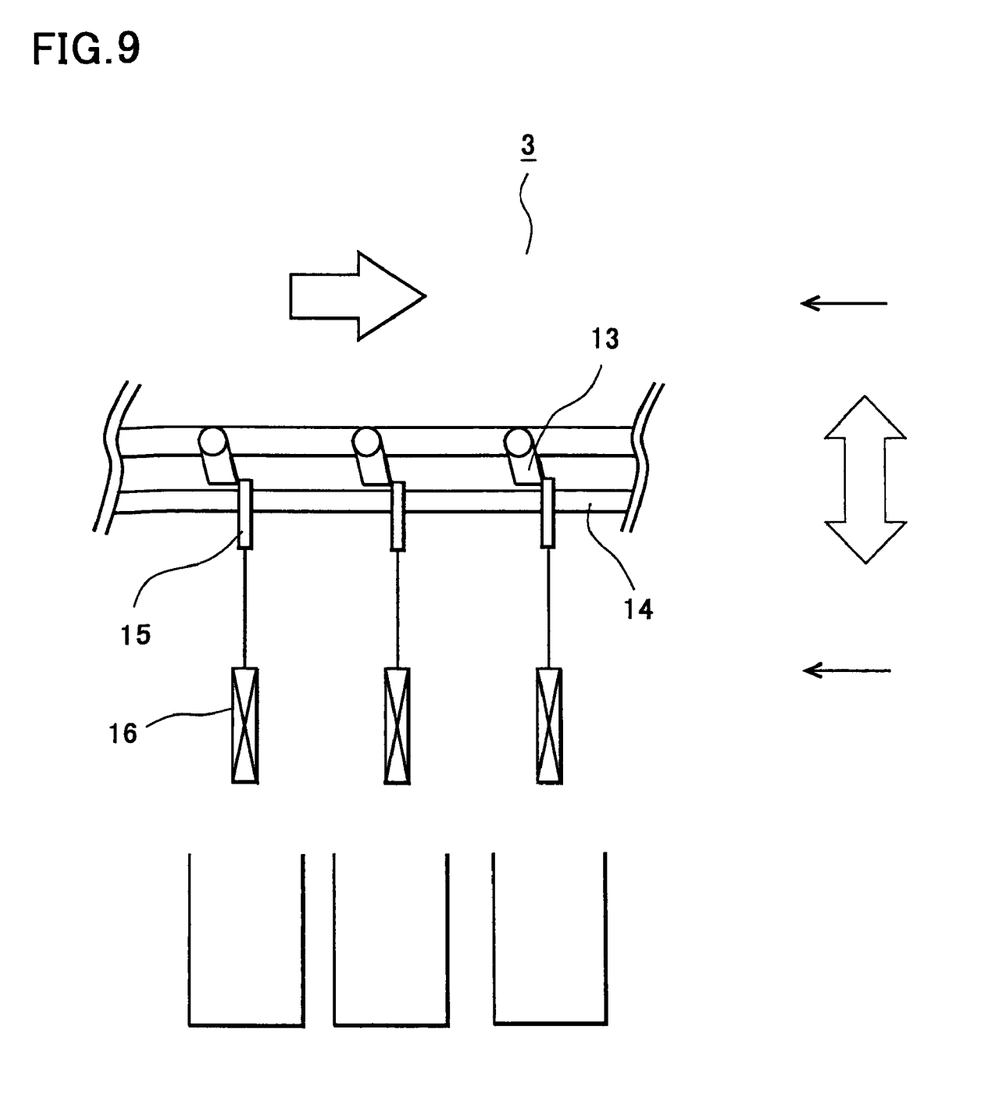
FIG. 9 is a diagram for describing a cross section, as viewed in the B-B direction, of chemical etching baths included in the entirety of the automatic plating apparatus shown in FIG. 7 according to a preferred embodiment or according to the related art.

Next, the conductive member 21 is washed in a water washing bath 4 and, after that, an oxide film that has become attached to the conductive member 21 in water washing bath 4 is removed in an acid activation bath 5. Next, the conductive member 21 is washed in a water washing bath 6 and, after that, plating is carried out in a solder plating apparatus 7. Since the solder plating liquid is strongly acidic, the plating layer surface after plating becomes acidic. The color of the plating film changes on such a surface as time elapses and the solderability deteriorates. Therefore, the acid that remains on the plating layer surface is neutralized and the attached organic substance is removed in a water washing bath 8 and in a neutralization process bath 9. After that, the conductive member 21 is washed in a water washing bath 10 and in a hot water washing bath 11 and is dried in a drying apparatus 12. FIG. 9 is a cross sectional view in the B-B direction of chemical etching bath 3 shown in FIG. 8.

The reaction of chemical etching bath 3 is as described above. Here, the mechanism of this plating apparatus is described. Lateral transfer-type pushers 13 and a conveyance rail 14 are both moveable in the upward and downward directions in this plating apparatus. Then, the upper limit positions and the lower limit positions of these moveable ranges are determined so that the above repeatedly move between those limit positions. Hooks 15 for hanging are hung from conveyance rail 14 at appropriate intervals in accordance with the purpose of work. The intervals are usually set at intervals corresponding to the distance between the centers of adjacent baths. Then, auxiliary plating racks 16 for hanging conductive members 21 to be plated are hung from these hooks 15 for hanging and are set in this plating apparatus. Next, lateral transfer-type pushers 13 are described. The distance between lateral transfer-type pushers 13 is basically the same as the distance between the centers of adjacent baths. Then, these lateral transfer-type pushers 13 are installed in single arms so that, when a hook 15 for hanging is transferred by one span in the direction of work, a pusher is returned by the same amount. Then, with these lateral transfer-type pushers 13, a hook 15 for hanging is transferred by one span at the upper limit positions of a conveyance rail 14 and these lateral transfer-type pushers 13 are returned by the same amount at the lower limit positions of a conveyance rail 14. In addition, conveyance rail 14 moves in the upward and downward directions and does not move in the direction of progress. These actions are repeated and, thereby, this plating apparatus functions.

The plating apparatus has one pre-plating process line and one solder plating line . There are cases wherein, for example, a plating film of Sn is formed as first plating film 22 and a plating film of Sn—Bi is formed as second plating film 23 of conductive member 21, and wherein a plating film of Sn is formed as first plating film 22 and a plating film of Sn—Ag is formed as second plating film 23 of conductive member 21. In both cases the same Sn plating liquid can be utilized for the formation of the first plating film while different plating liquids must be utilized for the formation of the second plating film. Therefore, after the first plating film is formed on conductive member 21, the plating apparatus is once stopped. Then the plating liquid in the bath is switched to the plating liquid for the second plating film and, then, the plating film is formed on the conductive member 21.

In addition, according to the above plating apparatus, the plating bath contains a plating liquid for forming a plating film on conductive member 21 and an electrode for supplying current to conductive member 21. Here, the electrode installed within this plating bath is used primarily as an anode in electrical plating. Then, conductive member 21 is immersed in this plating bath and, conductive member 21 becomes a cathode and, thereby, a plating film is formed on a conductive member 21. At this time, the plating work is carried out by placing conductive member 21 on a rectangular auxiliary plating rack 16 formed of two main pillars. There are conductive members 21 having, for example, different package sizes, different package designs and different properties. Then, plating work is carried out by applying a strong current density to the plating liquid when a thick plating film is formed on such conductive members 21. A plating film having a variety of thicknesses is formed primarily by adjusting the current density in such a manner.

In addition, it is known that in a method of electrical plating, the closer to the edge the position of application of current in conductive member 21 becomes, the greater the current density becomes and the thicker the formed plating film becomes. Moreover, the upper limit of the range of current density that is appropriate for the plating liquid is referred to as the maximum current density. By utilizing this maximum current density, plating time can be reduced. However, in the case that this maximum current density is exceeded, the plating surface becomes fogged and, furthermore, burn deposits or powder deposits are formed. Moreover, it is also known that when the limit current density is reached, no plating film can be formed.

PROBLEM TO BE SOLVED BY THE INVENTION

The first problem is referred to in the following. As described above, solder plating apparatus has one plating pre-processing line and one solder plating line. Therefore, in the case that a plurality of combined plating films are formed on conductive member 21, a problem arises wherein work cannot be sequentially carried out when combinations of plating films are switched. In other words, this plating apparatus allows sequential formation of plating films, which are the same combination by sequentially immersing conductive member 21 in the prepared plating liquid. However, in accordance with usage applications wherein the plated conductive member 21 is utilized, there is a problem wherein excessive time and effort must be spent to replace the plating liquid because the utilized plating liquid differs.

In addition to the above description, a great effort must be made in order to manage the solder plating line. There is a case wherein one type of plating liquid is utilized in one plating bath and, after that, different another type of plating liquid is utilized. At this time the liquid components of the latter plating liquid are changed, unless the former plating liquid is completely removed from inside of plating bath. In addition, in the case that the utilized plating liquid components differ, the anodes utilized in the plating bath also differ and the anodes must be changed. That is to say, there is a problem wherein great effort must be made concerning maintenance, such as management of the plating liquid and management of the plating bath.

The second problem is referred to in the following As mentioned above, the plating bath contains a plating liquid for forming a plating film on conductive member 21 and an electrode for supplying current to conductive member 21 in solder plating method and the plating apparatus used in the method. Then, a plating film is formed on the conductive member 21 using such a plating apparatus. However, in accordance with the usage application, conductive member 21 has a variety of surface areas or designs. Therefore, all portions of the surface of conductive member 21, which work as a cathode, do not necessarily allow a uniform current to pass through. In other words, the respective portions of conductive member 21 are not necessarily located at equal distances from the anode. Then, plating work is carried out by placing conductive member 21 on rectangular auxiliary plating rack 16 formed of two main pillars in this plating apparatus. Therefore, as for conductive member 21, the closer to the edge of conductive member 21 the portion on which the current density concentrates, the greater the current density becomes concentrated and the thicker the plating film formed. A thinner plating film is formed on the center portions of conductive member 21, in comparison with the edge. In addition, there is a problem wherein, when a plating film is formed on conductive member 21, a plating film is easy to be formed on portions having a high current density.

MEANS FOR SOLVING THE PROBLEM

The preferred embodiments of this invention are provided in view of the above described problems with the related art and a plating apparatus of the preferred embodiments is a plating apparatus having a plating pre-processing line and a plating line wherein the plating line has a plurality of plating baths and a plating liquid containment bath is provided in a desired plating bath from among the plating baths.

The plating apparatus of the preferred embodiments preferably has a plurality of plating baths underneath the conveyance rail in the plating line. Then, plating liquid containment baths are installed corresponding to these plating baths and are provided with a function of making plating liquid shift between two baths. Thereby, a plurality of combined plating films of a single layer, or of two or more layers, can be sequentially formed on a conductive member using one conveyance rail.

In addition, the preferred embodiments of the present invention are provided in view of the above described problem with the related art and a plating method of the preferred embodiments is a plating method for forming a plating film by placing an electrode for supplying current and a conductive member within a plating bath containing a desired plating liquid and by applying electricity, the current density flowing from the electrode is set within the optimal range of current density of the plating liquid. Then the conductive member is placed on an auxiliary plating rack and, after that, the plating film is formed on the conductive member.

According to the plating method of the preferred embodiments, preferably the conductive member and the auxiliary plating rack are integrally utilized as the other electrode of the pair. Then the auxiliary plating rack is positioned between the electrode and the conductive member so that the thickness of the plating film and the distribution of the composition of the plating film can be adjusted.

In addition, a plating apparatus of the preferred embodiments, which is provided in view of the problem with the related art, is a plating apparatus having a plating bath containing a desired plating liquid, an electrode for supplying current, and an auxiliary plating rack placing conductive member, wherein the auxiliary plating rack comprises conductive member and the plating film is formed with the conductive member already provided.

The auxiliary plating rack is preferably a rectangular parallelepiped formed of four main pillars, and the conductive member is placed within the auxiliary plating rack, and the plating film is formed in the plating apparatus of the present invention. Thereby, uniform current density can be applied to all of the portions of the conductive member, even when the surface area, the design, or the like, of the conductive member differ.

PREFERRED EMBODIMENTS OF THE INVENTION

First, a plating apparatus according to the first embodiment, which is a plating apparatus having a plating pre-processing line and a plating line is described. The plating line includes plating baths for forming a plating film layer of a plurality of patterns and the respective plating baths have plating liquid containment baths.

Figure 1:
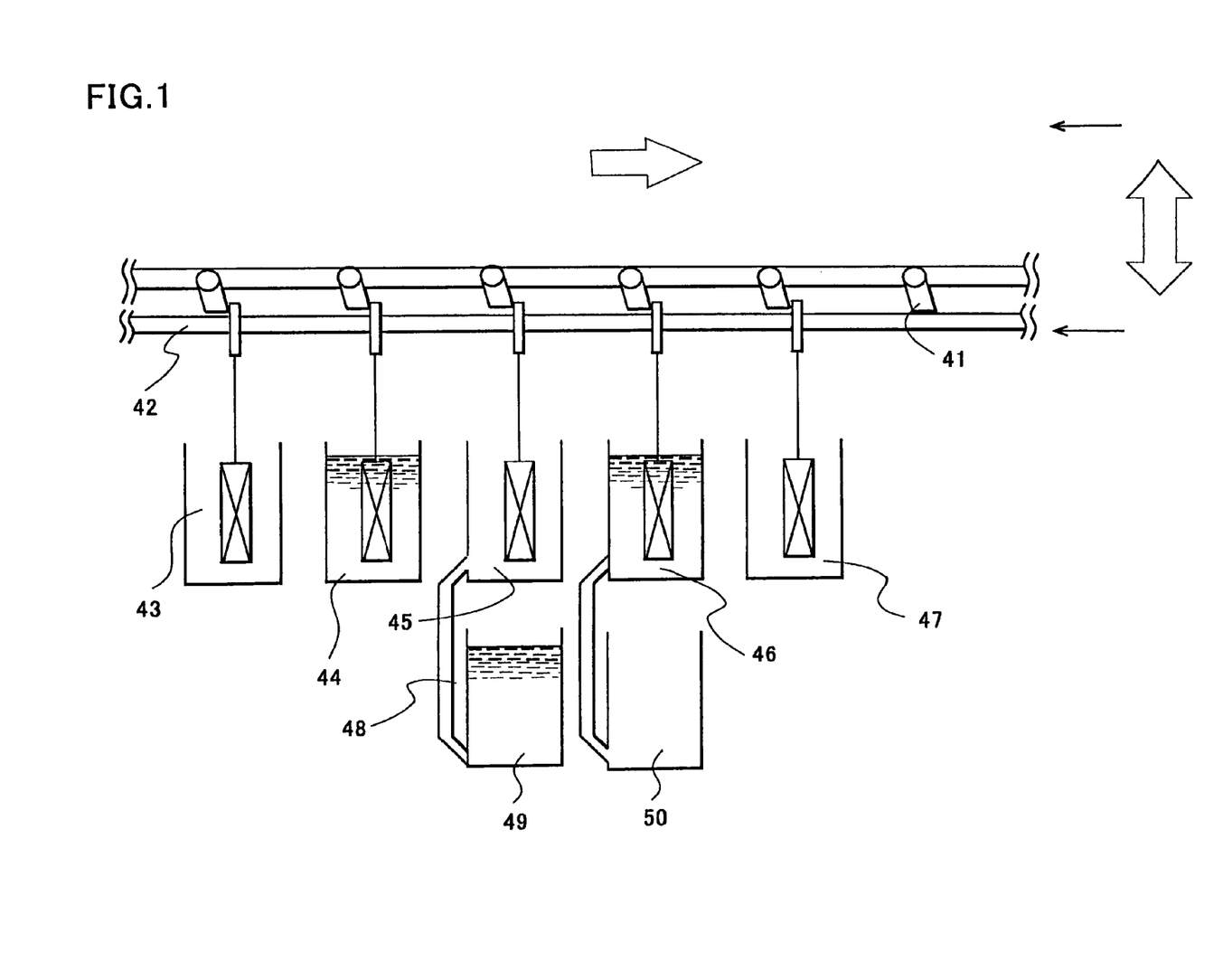
FIG. 1 is a diagram for describing a plating line used in a plating apparatus of a preferred embodiment.

FIG. 1 is a layout schematically showing the function of the solder plating line for implementing the plating apparatus of the preferred embodiment. A pre-dip bath 43, a first plating bath 44, a second plating bath 45, a third plating bath 46 and a water washing bath 47 are installed underneath a conveyance rail 42 in this solder plating line. Then, conductive members 21 are transferred in pitch by pitch by means of lateral transfer-type pushers 41 and plating films are formed on conductive members 21 using these baths (see FIG. 7) This apparatus is the same manner as in the related art.

In this embodiment, as many plating liquid containment baths as necessary are installed in correspondence with the plating baths. As shown in FIG. 1, for example, a plating liquid containment bath is not installed in first plating bath 44. A first plating liquid containment bath 49 is installed in second plating bath 45 and second plating liquid containment bath 50 is installed in third plating bath 46. In this case, the plating liquid containment baths (the plating liquid containment baths will be called containment bath in the following) are installed underneath the plating baths so that the workspace can be efficiently utilized and so that the plating liquids can be contained for a short period of time when the plating liquid is contained. Thereby, this solder plating line includes a plurality of combined plating films which can be sequentially formed on conductive member 21 using one conveyance rail.

Figure 2:
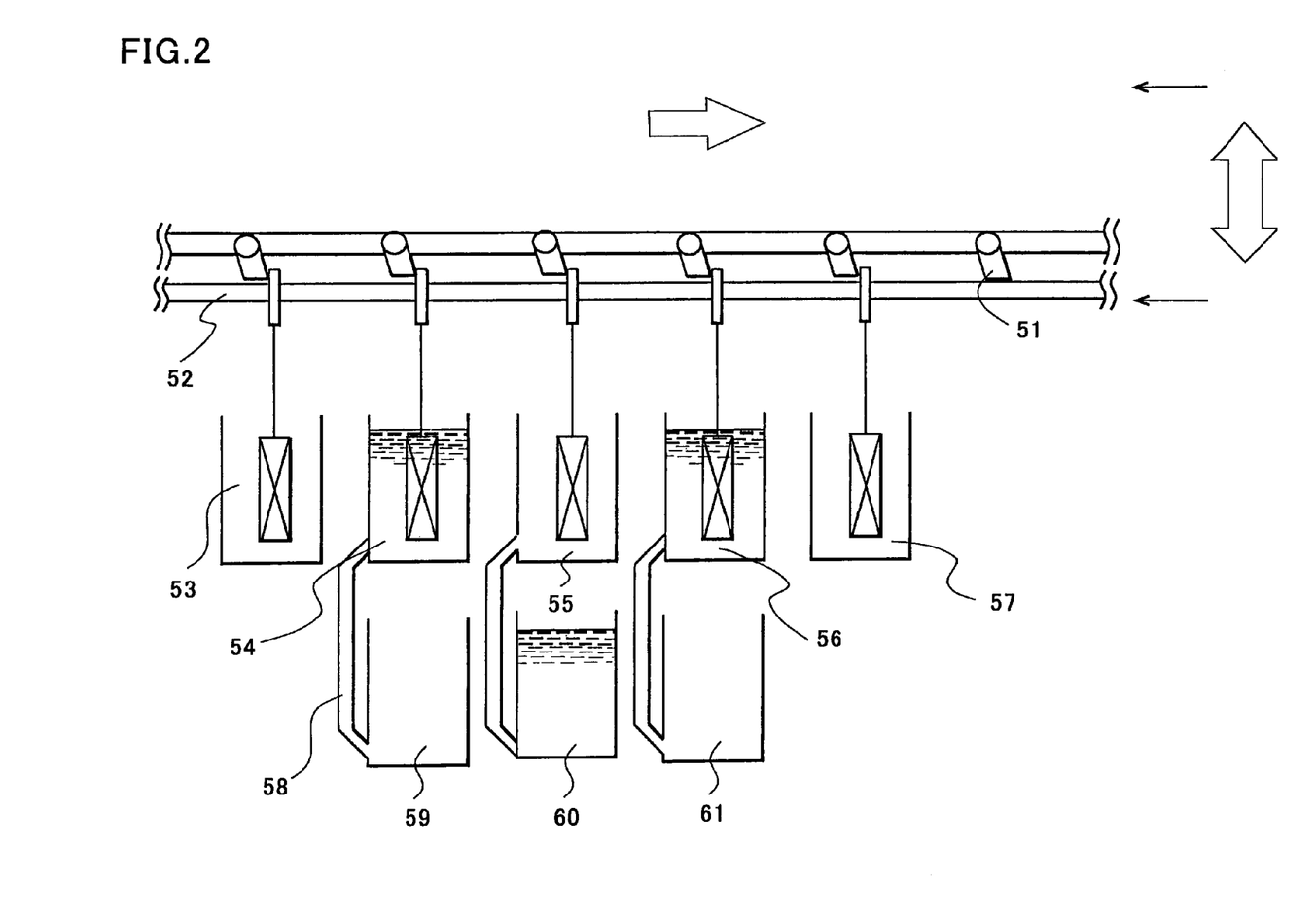
FIG. 2 is a diagram for describing a plating line used in the plating apparatus of the preferred embodiment.

FIG. 2 is a layout schematically showing the function of a solder plating line for implementing a plating apparatus of the preferred embodiment. A pre-dip bath 53, a first plating bath 54, a second plating bath 55, a third plating bath 56 and a water washing bath 57 are installed underneath a conveyance line 52 in this solder plating line. Then conductive members 21 are transferred in pitch by pitch by means of lateral transfer-type pushers 51 and plating films are formed on conductive members 21 using these baths.

Then, containment baths are installed for all of the plating baths. In FIG. 2, for example, a first containment bath 59 is installed in first plating bath 54, a second containment bath 60 is installed in second plating bath 55 and a third containment bath 61 is installed in third plating bath 56, respectively. In this case, also, as described above using FIG. 1, the containment baths are installed underneath the plating baths. Thereby, in this solder plating line a plurality of combined plating films can be sequentially formed in accordance with the usage application.

The first embodiment will be described in detail below. The conveyance mechanism of this solder plating line is the same as above described FIG. 9. In the solder plating line of this FIG. 1, for example, a plating liquid of Sn is contained in first plating bath 44, a plating liquid of Sn—Bi is contained in second plating bath 45 and a plating liquid of Sn—Ag is contained in third plating bath 46. Then, the necessary plating baths from among these plating baths are selected in accordance with the usage applications of conductive member 21 to be plated. In the unused plating baths, the plating liquids in the plating baths are shifted to plating liquid containment baths. In this embodiment, however, a plating liquid is always contained in first plating bath 44, for containing a plating liquid of Sn, and conductive member 21 is immersed in this plating liquid of Sn. As a result, a single plating film layer of Sn is formed on conductive member 21 or a plating film having a first layer of Sn and a second layer of Sn—Bi or Sn—Ag is formed. Here, the structure of the lead member is the same as FIG. 7 and the same symbols are used.

First, a case is described wherein first plating film 22, which is a single Sn layer, is formed alone on conductive member 21. A plating liquid of Sn is always contained in first plating bath 44, for containing a plating liquid of Sn, and a plating film of Sn is formed on conductive member 21. First, the hydroxide film on the surface is removed in pre-dip bath 43 and, then, conductive member 21 that has been processed in the pre-plating process line is immersed in the plating liquid of Sn in first plating bath 44. Then, no plating films are formed on conductive member 21 during this time in second plating bath 45 and third plating bath 46 and, therefore, plating liquids in the baths are shifted to first containment bath 49 and second containment bath 50. Conductive member 21, on which a plating film of Sn has been formed in first plating bath 44, is conveyed to second plating bath 45 and to third plating bath 46. However those plating baths 45 and 46 do not contain any plating liquid and, therefore, no plating films are formed. Next, the surface of conductive member 21, on which a plating film has been formed, is cleaned in water washing bath 47. As a result, a single plating film layer of Sn is formed on conductive member 21.

Second, a case is described, wherein first plating film 22 and second plating film 23, are formed on conductive member 21. First, first plating bath 44 always contains a plating liquid of Sn and, therefore, first plating film 22 of Sn is formed on conductive member 21. Then, the plating bath for forming second plating film 23 is selected in accordance with the usage application of this conductive member 21. Here, in the case that second plating film 23 of Sn—Bi is formed, first, a plating liquid of Sn—Ag in third plating bath 46 is moved to second containment bath 50. In the case that a second plating film of Sn—Ag is formed, a plating liquid of Sn—Bi in second plating bath 45 is shifted to first plating liquid containment bath 49 and a plating liquid of Sn—Ag is returned from second containment bath 50 to third plating bath 46. As a result, two plating film layers of Sn and of Sn—Bi, or of Sn and of Sn—Ag, are formed on conductive member 21.

Here, in the plating apparatus of FIG. 1, the metal material of the plating liquid in first plating bath 44 is Sn, the metal material of the plating liquid in second plating bath 45 is Sn—Bi and the metal material of the plating liquid in third plating bath 46 is Sn—Ag. In addition, the solutions from which these metals and solvents for solving these metals have been removed have the same liquid constitutions and, therefore, plating films can be sequentially formed on conductive member 21. In some cases, however, plating films are formed on conductive member 21 using plating liquids having different liquid constitutions. At this time, plating baths containing pure water are prepared between plating baths so that the surface of conductive member 21, which has been plated, is washed and, thereby, these different plating liquids are prevented from mixing with each other. In addition, in the case that this pure water is not necessary, the pure water is contained in the containment baths. Thereby, a plurality of combined plating films can be sequentially formed on conductive member 21 using one conveyance rail, regardless of the liquid constitutions of the plating liquids.

The second embodiment is described in detail. In the solder plating line of the above FIG. 2, a plating liquid of Sn is contained in first plating bath 54, a plating liquid of Sn:Bi=98 (wt. %): 2 (wt. %) is contained in second plating bath 55 and plating liquid of Sn:Bi=43 (wt. %): 57 (wt. %) is contained in third plating bath 56. Then, necessary plating baths from among these plating baths are selected in accordance with the usage application of conductive member 21 and the plating liquids in the plating baths that are unused are shifted to containment baths. As a result, a single plating film layer of Sn:Bi=98 (wt. %): 2 (wt. %) may be formed on conductive member 21, two plating film layers having a first layer of Sn and a second layer of Sn:Bi=43 (wt. %): 57 (wt. %) may be formed on conductive member 21 or two plating film layers having a first layer of Sn:Bi=98 (wt. %): 2 (wt. %) and a second layer of Sn:Bi=43 (wt. %): 57 (wt. %) may be formed on conductive member 21.

In this embodiment, a plating liquid of Sn:Bi=98 (wt. %): 2 (wt. %) can be utilized in order to form first plating film 22 on conductive member 21. At this time, approximately several % of Bi may be included in the plating liquid and, thereby, occurrence of whiskers (crystal in a needle form) can be prevented to a significant extent from being formed on first plating film 22.

Accordingly, the present embodiment provides plating baths containing a plurality of plating liquids of differing constitutions, and containment baths are installed in all of these plating baths, or in the necessary plating baths. Thereby, plating liquids are shifted between each of these pairs of upper and lower baths in accordance with the usage application of conductive member 21. As a result, a plurality of combined plating films can be sequentially formed using one conveyance rail.

That is to say, a plurality of combined plating films can be sequentially formed on conductive member 21 using one conveyance rail. Thereby, although it was necessary in the related art to temporarily stop the plating apparatus according to the combinations of the plating films, it becomes unnecessary to replace the plating liquids in the baths in the preferred embodiment. As a result, working time can be greatly shortened, and time and effort necessary to replace the plating liquids can be eliminated. In addition, in the case that one plating liquid is replaced with another in the same bath, the respective plating liquids would mix in the related art. In the preferred embodiment however, as described above, liquid composition is the same. Therefore, even when plating liquid mix with each other modification of liquid composition can be prevented, thereby, management of the plating liquids and effort necessary for maintenance of plating baths or other plating equipment can be greatly reduced.

There are other plating methods that allow the sequential formation of a plurality of combined plating films using one conveyance rail. For example, there are cases for forming plating films in the second and third plating baths while shifting the plating liquids in the first plating bath to the first containment bath, and for forming a single plating film layer solely in the third plating bath while shifting the plating liquids in the first and second plating baths to the first and second containment baths. In addition, a thick plating film can be formed on conductive member 21 by using adjacent plating baths to contain plating liquids of the same composition.

In any case, as described above, it is possible to sequentially form a plurality of combined plating films using one conveyance rail by shifting the plating liquids between each of the pairs of baths.

Though a case of solder plating is described above as an example, this plating apparatus can be utilized without limitation in solder plating. For example, there are Sn plating, Cu plating, Ni plating, and the like. This plating apparatus can be used in these cases so that a plurality of combined plating films can be sequentially formed on conductive member 21 using one conveyance rail.

Figure 3:
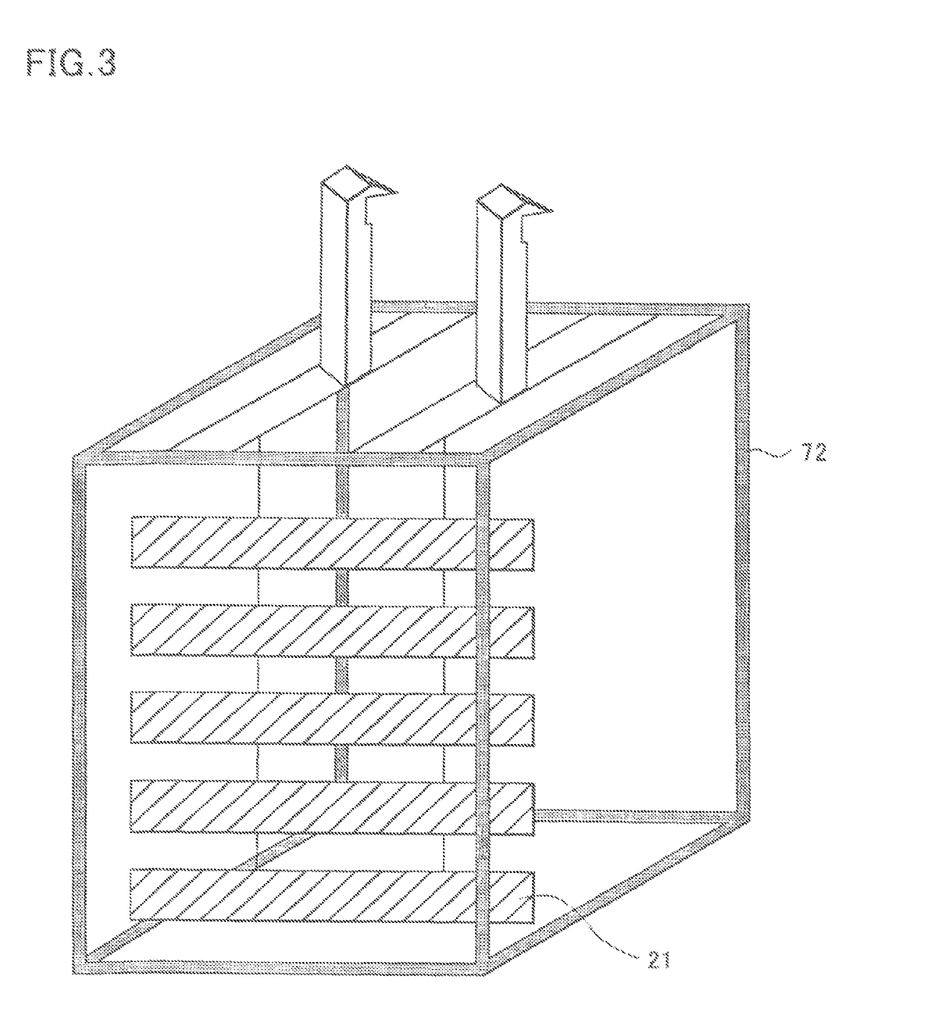
FIG. 3 is a diagram for describing an auxiliary plating rack used in the plating apparatus of a preferred embodiment.
Figure 4:
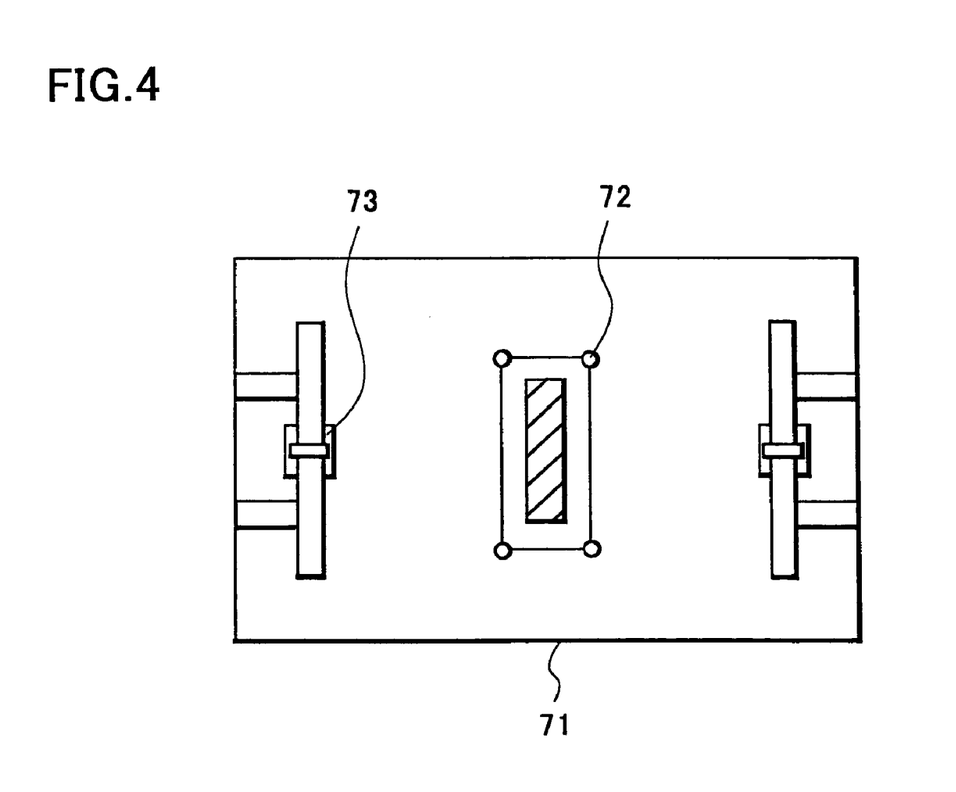
FIG. 4 is a layout, as viewed from above, of plating work on a plating bath used in a plating apparatus of a preferred embodiment.

Next, an auxiliary plating rack which is a rectangular parallelepiped structure with four main pillars and a plating method wherein this auxiliary plating rack is used are described in reference to FIGS. 3, 4 and 7 as the second embodiment.

FIG. 3 is a layout schematically showing an auxiliary plating rack used in the implementation of a plating method of the preferred embodiment. Then, FIG. 4 is a layout, of conductive member 21 (see FIG. 7) placed in auxiliary plating rack 72 shown in FIG. 3 being immersed in plating bath 71. Here, conductive member 21 is, in most cases, used as a cathode in electrical plating and, therefore, a case is described wherein the electrode is used as anode 73.

In the present embodiment, a rectangular parallelepiped auxiliary plating rack 72 formed of four main pillars is used when a plating film is formed on conductive member 21. Thereby, uniform current density is applied to conductive member 21, being any of a variety of types of different surface areas, or the like.

Concretely, an appropriate range of current density exists for each plating liquid when plating work is carried out. A high quality plating film can be formed by carrying out plating work with an appropriate range of current density. Then, conductive member 21 is placed in a rectangular parallelepiped auxiliary plating rack 72 formed of four main pillars and is immersed in the plating liquid in plating bath 71 together with this auxiliary plating rack 72. This auxiliary plating rack 72 is formed of conductive material so as to integrally form a cathode with conductive member 21. Then, as shown in FIG. 4, conductive member 21 is placed so as to be positioned at the center of auxiliary plating rack 72 and, therefore, the main pillars of auxiliary plating rack 72 are positioned between anode 73 and conductive member 21. Thereby, the main portion of the current of high density is directed to the main pillars of auxiliary plating rack 72. In the portion where the remaining current density is weak, the plating film is to be formed on conductive member 21. As a result, a plating film having a uniform thickness and having a uniform composition distribution can be formed on a variety of surface areas of conductive members 21, such as conductive member 21 having a large surface area and conductive member 21 having a small surface area.

There is a case, for example, wherein a plating film is formed on conductive member 21 having a large surface area. Different levels of current density are applied to the center portion and to the edge portion of conductive member 21 in the case where the surface area thereof is large. However, as described above., the main pillars of auxiliary plating rack 72 are positioned between conductive member 21 and anode 73 and, thereby, the high current density can be avoided by portion to be plated. As a result, the difference in current density between the portion at the center of conductive member 21 close to anode 73 and the edge portion of conductive member 21 distant from anode 73 becomes small. Then a plating film of a uniform film thickness and of a uniform plating composition is formed on the surface of this conductive member 21.

In addition, there is a case wherein a plating film having a first layer of Sn, which is Pb-free plating, and a second layer of Sn—Bi is formed. At this time, a second plating film layer of Sn—Bi is plated to have a range of thickness of approximately 1 pm to 5 pm. Here, plating is carried out without utilizing auxiliary plating rack 72. In this case, due to the above electrical plating characteristics, variation in plating film thickness may occur, particularly at the edge portion and center portion of conductive member 21. Alternatively, at center portion of conductive member 21, a portion wherein the plating film is not formed may occur. However, using auxiliary plating rack 72, a plating film of a uniform film thickness and of a uniform plating composition can be formed on the surface of conductive member 21.

In addition, though an embodiment of a case wherein electrode 73 is anode is described above, a plating film can be formed on conductive member 21 in the case wherein electrode 73 is cathode.

Figure 5:
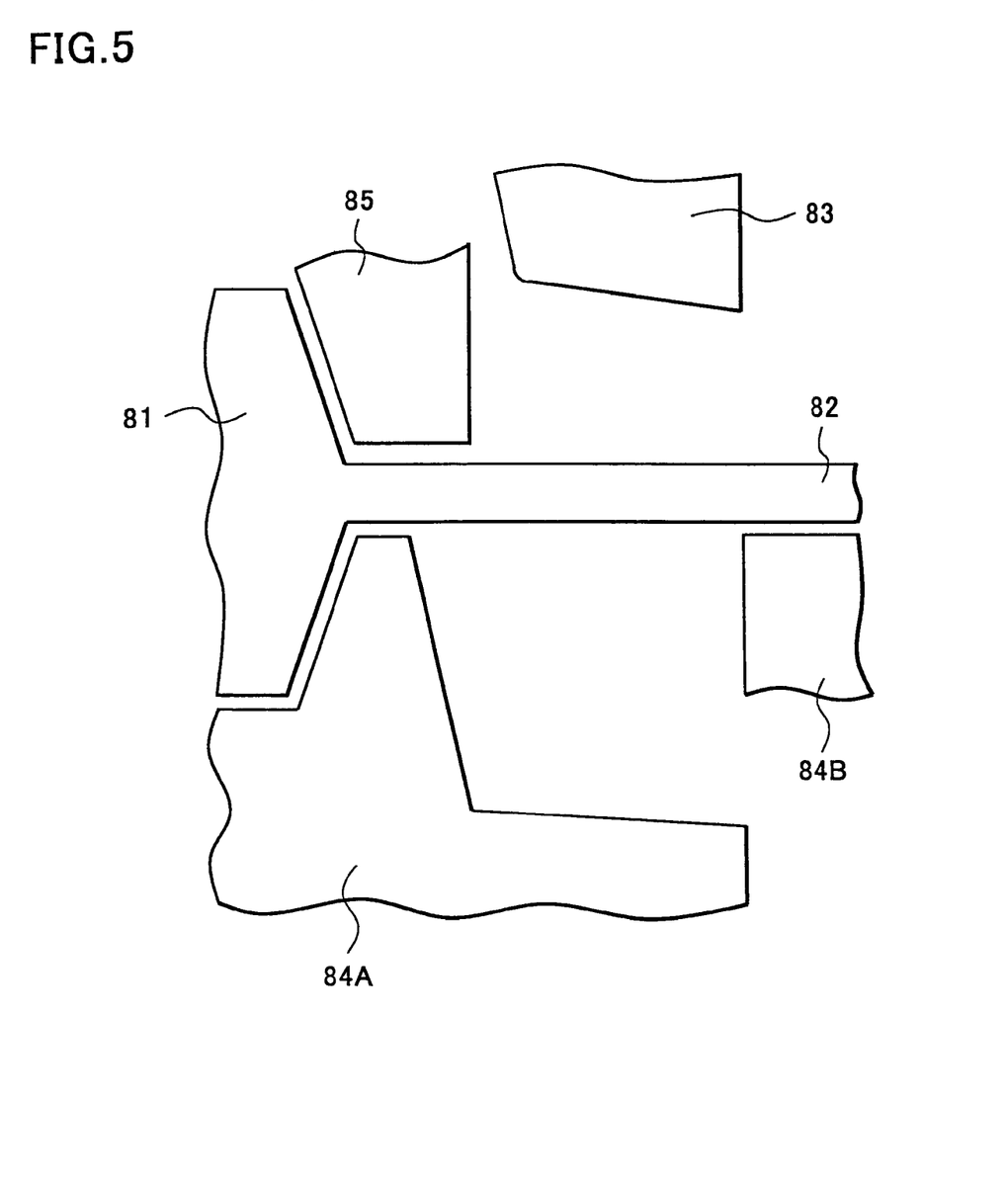
FIG. 5 is a diagram for describing a manufacturing method for a semiconductor device of a preferred embodiment.

Finally, a plating method for a lead used for a semiconductor device is described in reference to FIGS. 5 through FIG. 7 as the third embodiment.

First, in a case, in particular, where first plating film 22, which is plated on the surface of conductive member 21 such as of a simple Cu, a Cu alloy or an Fe—Ni alloy, is formed using a plating liquid having a main metal material of simple Sn, a smooth film is formed on the surface of first plating film 22. In a case that two types of metals, such as Sn—Bi, are plated as first plating film 22, the first plating film has a property that Bi, having a greater ionization tendency, has priority of deposition. As a result of the phenomenon, the surface of first plating film 22 is formed as a rough film made of deposited grains.

As a result, in a case that the lead frame is contacted with processing equipment during work, the problem described below occurs. During the process of bending, for example, there is a process of determining whether or not an IC is a good product by making the electrical terminals make contact with the lead frame. In this process, the grains forming the rough surface, which have had priority of deposition, come off, and the grains that have come off become attached between leads. Thereby, defects are caused in the process of determining whether or not an IC is a good product. In addition, there is a case wherein the friction resistance between the surfaces of the lead frame is reduced, and the grains stay on the conveyance means that makes contact with the lead frame when the lead frame is conveyed.

Here, a problem that occurs during the bending process is concretely described. FIG. 5 is a schematic view of a metal mold for bending a lead frame. Then, as illustrated, a lead frame 82 of a semiconductor device 81 is cut or bent by means of a punch 83 when a problem occurs.

First, plated lead frame 82 is placed on supports 84A and 84B. Then the mold as well as lead frame 82 of semiconductor device 81 are secured by means of support 84A and a lead support means 85. At this time, the tip of lead frame 82 is placed on support 84B. Then, lead frame 82 is cut by means of punch 83 while the remaining portion is bent. At this time, the bottom of punch 83 and the surface of lead frame 82 make contact with each other wherein enlarged deposited grains adhere to the bottom of punch 83 as waste material. Alternatively, a phenomenon occurs such that deposited grains adhere to lead frame 82.

In addition, lead frames presently used have approximately 200 pins and the pitch of the pins becomes as narrow as 0.4 mm. Moreover, semiconductor devices, themselves, have become greatly reduced in size and, therefore, it is assumed that the attached waste material easily causes defects. Therefore, it is preferable for a semiconductor device to be plated using a plating liquid having a main metal material of simple Sn, or the like, in a manufacturing process as described above.

On the other hand, it is shown that a microscopic amount of Bi is mixed according to the manufacturing method described below in a plating film having a main metal material of simple Sn.

As described in the first embodiment, it is possible to freely select the plating liquid in the plating apparatus of the preferred embodiment and it is possible to form first plating film 22 of simple Sn on the surface of conductive member 21. As described in the second embodiment, however, auxiliary plating rack 72 is utilized at the time of plating on conductive member 21 and, therefore, a plating film is formed on the surface of auxiliary plating rack 72. Then, auxiliary plating rack 72 is cleaned in the subsequent step so that the plating film on auxiliary plating rack 72, itself, is removed. However, auxiliary plating rack 72 is repeatedly utilized in one conveyance line. Therefore, mixing into the plating liquid containing a metal material of simple Sn of a microscopic amount of Bi cannot be avoided. In addition, a microscopic amount of Bi, as an impurity, is mixed into the anode used as electrode 73. Accordingly, a certain amount of Bi relative to Sn is mixed into the plating liquid of simple Sn. There is a possibility that even when first plating film 22 is designed as a plating film made of simple Sn, a microscopic amount of Bi in the plating film is practically formed.

Therefore, the amount of Bi mixed into first plating film 22 that causes a problem is examined. In a case that 0 wt. % to 0.5 wt. % of Bi is included in Sn, no deposition of grains occurs. In addition, in a case that 0.5 wt. % to 1.0 wt. % of Bi is included in Sn, almost no enlargement of deposited grains occurs. However a microscopic amount of deposition of grains at a level that does not cause problems may occur. While in a case that 1.0 wt. % to 3.0 wt. % of Bi is included in Sn, a problematic level of enlargement of deposited grains occurs. Then, in a case wherein the enlargement of the deposited grains occurs on the surface of the first plating film, enlargement of the deposited grains on the surface of second plating film 23 naturally occurs.

It is understood from the above description that grain enlargement does not occur when first plating film 22 is formed as a plating film of simple Sn or of Sn having 1 wt. %, or less (particularly 0 wt. % to 0.5 wt. %), of Bi, even in the case of the formation thereon of an Sn—Bi plating film 23 of any concentration on first plating film 22.

In the following, a semiconductor device utilizing a lead frame is described wherein a semiconductor chip is mounted on a lead frame and wiring is generally carried out using fine metal wires. After that, the semiconductor chip is sealed in a mold and the leads that are exposed from the mold are bent. Then, this semiconductor device, which has become a standalone product, is supplied to the user after electrical measurement via the leads. Then, the user fixes the semiconductor device on the electrodes of a mounting board via a brazing material.

Here, it is possible to carry out a plating process before the semiconductor chip is mounted as well as after the semiconductor chip has been sealed in a mold. In a case that a plating process is carried out before the semiconductor chip is mounted, it is necessary to process the connection portions of the fine metal wires so that no plating film is formed on the connection portions. On the other hand, in a case that a process is carried out after molding, it is possible to immerse metal conductive portions exposed from the mold in plating chemicals and, therefore, there is an advantage wherein selective coating is unnecessary. Here, though a semiconductor chip is described as the circuit device, a passive element or composite elements may be sealed in a mold. In addition, as for the molding material, a thermoplastic resin, a thermosetting resin, ceramic, or the like, can be processed as an object.

In addition, the preferred embodiment can be applied to the electrodes of a CSP, or the like, wherein semiconductor chips are secured on electrodes on a support board in a matrix and are separated after molding. In this case, a means for applying electricity to all of the electrodes is necessary.

EFFECTS OF THE INVENTION

As is clear from the above description, the following effects are obtained in the plating apparatus of the preferred embodiments of the present invention.

As for the first effect, this plating apparatus has a function of shifting the plating liquid between the two baths in the solder plating line. Thereby, a single plating film layer or a plurality of combined plating films can be sequentially formed using one conveyance rail. Therefore, it becomes unnecessary to replace the plating liquid with another plating liquid whenever the type of plating film formed on the conductive member is switched, and it is not necessary to temporarily stop the plating apparatus. Thereby, a plurality of combined plating films can be sequentially formed on the conductive member using one conveyance rail. Therefore time and effort necessary to replace the plating liquids can be eliminated. In addition, when one plating liquid is replaced with another in the same bath, the respective plating liquids can be prevented from mixing with each other. Thereby, management of the plating liquids and effort necessary for maintenance of plating baths or other plating equipment can be greatly reduced.

As for the second effect, by carrying out plating work according to the plating method of the preferred embodiments of the present invention, the majority of high current density that is otherwise applied to the conductive member, which is of a variety of types having different surface areas, or the like, can be avoided when plating is carried out. Thereby, plating process can be carried out in a variety of types of conductive members having different surface areas and designs, while the current density is in an appropriate range for the utilized plating liquid. Moreover a uniform current density is applied to the entire surface of the conductive member after electrolysis in the plating liquid is controlled. As a result, the thickness of the plating film and the plating composition distribution can be optimized so that a uniform plating film is formed on a variety of conductive members. As for the third effect, the auxiliary plating rack in a rectangular parallelepiped shape formed of four main pillars made of conductive members is utilized. Thereby, a plating film of high quality can be formed on a variety of conductive members of different surface areas, or the like.

As for the fourth effect, according to a manufacturing method for a semiconductor device wherein a plurality of plating films are formed on the surface of a conductive member, such as a simple Cu, a Cu alloy or an Fe—Ni alloy, a plating film is formed using a plating liquid having a main metal material of Sn—Bi, in particular, Sn into which a microscopic amount of Bi is mixed. Therefore deposition of grains does not occur on the surface of the first plating film and, even when they occur, they are microscopic deposited grains and, thereby, a manufacturing method for a semiconductor device having an excellent plating film can be implemented.

1 alkaline electrolytic washing bath
2 water washing bath
3 chemical etching bath
4 water washing bath
5 acid activation bath
6 water washing bath
7 solder plating apparatus
8 water washing bath
9 process bath
10 water washing bath
11 hot water washing bath
12 drying apparatus
13 lateral transfer-type pusher
14 conveyance rail
15 hook for hanging
16 auxiliary plating rack
21 conductive member
22 first plating film
23 second plating film
41 lateral transfer-type pusher
42 conveyance rail
43 pre-dip bath
44 first plating bath
45 second plating bath
46 third plating bath
47 water washing bath
48 pipe for passage of plating liquid
49 first plating liquid containment bath
50 second plating liquid containment bath
51 lateral transfer-type pusher
52 conveyance rail
53 pre-dip bath
54 first plating bath
55 second plating bath
56 third plating bath
57 water washing bath
58 pipe for passage of plating liquid
59 first plating liquid containment bath
60 second plating liquid containment bath
61 third plating liquid containment bath
71 plating bath
72 auxiliary plating rack
73, electrode

What is claimed is:
1. A manufacturing method for a semiconductor device comprising:
preparing a lead frame having Cu or Fe—Ni;
fixing the lead frame on a lead frame hold means;
after fixing the lead frame, circulating the lead frame and the lead frame hold means in a plating line;

forming a first plating film layer having a metal material of Sn on the lead frame; and forming a second plating film layer having a metal material of Sn—Bi on an outermost surface of the lead frame, wherein Bi included in a plating liquid that forms the second plating film layer is introduced into a plating liquid that forms the first plating film layer by the lead frame hold means, and the Bi included in the plating liquid that forms the first plating film layer is controlled in such a way that the Bi in the first plating film layer becomes below 1 wt. %. relative to the Sn in the first plating film layer.

2. The manufacturing method for a semiconductor device according to claim 1 wherein a semiconductor chip is connected on the lead frame and after forming a package that seals the lead frame and the semiconductor chip, a portion of the lead frame which is exposed from the package is bent to contact a bottom of a punch.

3. The manufacturing method for a semiconductor device according to claim 1 or claim 2 comprising:

disposing an anode electrode in the plating liquid that forms the first plating film layer, wherein the Bi is supplied into the plating liquid that forms the first plating film layer by a dissolution of the anode electrode and is brought by the lead frame hold means, and controlling the amount of Bi included in the plating liquid that forms the first plating film layer.

4. The manufacturing method for a semiconductor device according to claim 1 wherein the Bi included in the plating liquid that forms the first plating film layer is controlled in such a way that the Bi in the first plating film layer becomes below 0.5 wt. %. relative to the Sn in the first plating film layer.

5. A manufacturing method for a semiconductor device comprising:

preparing a lead frame having Cu or Fe—Ni;

fixing the lead frame on a lead frame hold means;

after fixing the lead frame, circulating the lead frame and the lead frame hold means in a plating line;

forming a first plating film layer having a metal material of Sn on the lead frame; and forming a second plating film layer having a metal material of Sn—Bi on an outermost surface of the lead frame, wherein Bi included in a plating liquid that forms the first plating film layer is supplied by the dissolution of an anode electrode disposed in the plating liquid, and the Bi included in the plating liquid is controlled in such a way that a Bi in the first plating film layer becomes below 1 wt. %. relative to the Sn in the first plating film layer.

6. The manufacturing method for a semiconductor device according to claim 5 comprising:

connecting a semiconductor chip on the lead frame having the first plating film layer and the second plating film layer, and after forming a package sealing the lead frame and the semiconductor chip, bending a portion of the lead frame, which is exposed from the package, to contact a bottom of a punch.

7. The manufacturing method for a semiconductor device according to claim 5 wherein the Bi included in the plating liquid that forms the first plating film layer is controlled in such a way that the Bi in the first plating film layer becomes below 0.5 wt. %. relative to the Sn in the first plating film layer.

8. A manufacturing method for a semiconductor device comprising:

connecting a lead frame to a semiconductor chip;

forming a package which seals the semiconductor chip;

fixing the lead frame on a lead frame hold means;

after fixing the lead frame, circulating the lead frame and the lead frame hold means in a plating line;

forming a first plating film layer having a metal material of Sn on the lead frame; and forming a second plating film layer having a metal material of Sn—Bi on an outermost surface of the lead frame, wherein Bi included in a plating liquid forming the second plating film layer is introduced into a plating liquid that forms the first plating film layer by the lead frame hold means and wherein the Bi included in the plating liquid that forms the first plating film layer is controlled in such a way that the Bi in the first plating film layer becomes below 1 wt. %. relative to the Sn in the first plating film layer.

9. The manufacturing method for a semiconductor device according to claim 8 wherein a portion of the lead frame which is exposed from the package is bent to contact a bottom of a punch.

10. The manufacturing method for a semiconductor device according to claim 8 or claim 9, wherein an anode electrode is disposed in the plating liquid that forms the first plating film layer, the Bi is supplied into the plating liquid by a dissolution of the anode electrode and is brought by the lead frame hold means and the amount of Bi included in the plating liquid is controlled.

11. The manufacturing method for a semiconductor device according to claim 8 wherein the Bi included in the plating liquid that forms the first plating film layer is controlled in such a way that the Bi in the first plating film layer becomes below 0.5 wt. %. relative to the Sn in the first plating film layer.

12. A manufacturing method for a semiconductor device comprising:

connecting a lead frame to a semiconductor chip;

forming a package which seals the semiconductor chip;

after fixing the lead frame on a lead frame hold means, circulating the lead frame and the lead frame hold means in a plating line;

forming a first plating film layer having a metal material of Sn on the lead frame; and forming a second plating film layer having a metal material of Sn—Bi on an outermost surface of the lead frame, wherein Bi included in a plating liquid that forms the first plating film layer is supplied by the dissolution of an anode electrode disposed in the plating liquid, and the Bi included in the plating liquid is controlled in such a way that the Bi in the first plating film layer becomes below 1 wt. %. relative to the Sn in the first plating film layer.

13. The manufacturing method for a semiconductor device according to claim 12 wherein a portion of the lead frame which is exposed from the package is bent to contact a bottom of a punch.

14. The manufacturing method for a semiconductor device according to claim 12 wherein the Bi included in the plating liquid is controlled in such a way that the Bi in the first plating film layer becomes below 0.5 wt. %. relative to the Sn in the first plating film layer.

* * * * *